United States Patent
Takagi et al.

(10) Patent No.: US 8,715,533 B2
(45) Date of Patent: May 6, 2014

(54) DIELECTRIC RAW MATERIAL, ANTENNA DEVICE, PORTABLE PHONE AND ELECTROMAGNETIC WAVE SHIELDING BODY

(75) Inventors: Kazuhisa Takagi, Fukushima (JP); Yuko Takami, Fukushima (JP); Yuji Koyamashita, Fukushima (JP)

(73) Assignee: Asahi R&D Co., Ltd., Saitama-Shi (JP)

( * ) Notice: Subject to any disclaimer, the term of this patent is extended or adjusted under 35 U.S.C. 154(b) by 907 days.

(21) Appl. No.: 11/667,318

(22) PCT Filed: Dec. 13, 2005

(86) PCT No.: PCT/JP2005/022828
§ 371 (c)(1),
(2), (4) Date: May 9, 2007

(87) PCT Pub. No.: WO2006/064782
PCT Pub. Date: Jun. 22, 2006

(65) Prior Publication Data
US 2008/0058467 A1    Mar. 6, 2008

(30) Foreign Application Priority Data
Dec. 17, 2004   (JP) .................................. 2004-365363

(51) Int. Cl.
*H01B 1/24* (2006.01)
*H01B 1/04* (2006.01)
*G21F 1/00* (2006.01)

(52) U.S. Cl.
USPC ........... 252/511; 252/500; 252/502; 977/779; 977/780; 977/783; 977/785; 977/932

(58) Field of Classification Search
USPC .......... 252/500–511; 977/779, 780, 783, 785, 977/902, 932
See application file for complete search history.

(56) References Cited

U.S. PATENT DOCUMENTS

| 4,031,269 A | * | 6/1977 | Takahashi | 430/125.3 |
| 6,097,271 A | * | 8/2000 | Kozakoff | 333/204 |

(Continued)

FOREIGN PATENT DOCUMENTS

| EP | 0102650 A1 | 3/1984 |
| EP | 0480680 A1 | 4/1992 |

(Continued)

OTHER PUBLICATIONS

Notice of Reasons for Refusal issued Nov. 9, 2010 in Japanese Application No. 2006-548843.

(Continued)

*Primary Examiner* — Tri V Nguyen
(74) *Attorney, Agent, or Firm* — Birch, Stewart, Kolasch & Birch, LLP

(57) ABSTRACT

There are provided a high-permittivity dielectric raw material, an antenna device using the raw material and being useful as, especially, the built-in antenna device of a portable phone; a portable phone which can be reduced in weight, thickness and size, with an antenna radiation efficiency improved, and an electromagnetic wave shielding body for effectively shielding electromagnetic wave from an electric cooker.
A dielectric raw material A having carbons dispersed in a silicone rubber base material 1, wherein, in any one of dielectric raw materials A, 1) containing 150 to 300 pts.wt. of carbons per 100 pts.wt. of silicone rubber, 2) formed by crosslinking and molding a mixture of non-crosslinked silicone rubber, non-crosslinked organic polymer and carbons, and 3) formed by combining and blending at least two kinds of carbons having different shapes and selected from spherical carbon 2, flat carbon, carbon fiber with a specific aspect ratio, carbon nanotube and conductive carbon 3, carbons are unevenly distributed in a silicone rubber base material 1 or carbons are contained with at least part of them contacting each other.

14 Claims, 4 Drawing Sheets

(56) References Cited

U.S. PATENT DOCUMENTS

| | | | |
|---|---|---|---|
| 6,455,771 B1 * | 9/2002 | Han et al. | 174/388 |
| 6,783,703 B2 * | 8/2004 | Monden et al. | 252/511 |
| 2003/0047718 A1 | 3/2003 | Narayan et al. | |
| 2003/0047721 A1 | 3/2003 | Igarashi et al. | |
| 2003/0096104 A1 | 5/2003 | Tobita et al. | |
| 2003/0164427 A1 | 9/2003 | Glatkowski et al. | |
| 2003/0213939 A1 | 11/2003 | Narayan et al. | |
| 2004/0020681 A1 * | 2/2004 | Hjortstam et al. | 174/102 SC |
| 2004/0023701 A1 | 2/2004 | Hankui | |
| 2004/0152345 A1 * | 8/2004 | Reil et al. | 439/55 |
| 2005/0075150 A1 | 4/2005 | Takagi et al. | |
| 2007/0199729 A1 * | 8/2007 | Siegel et al. | 174/73.1 |
| 2011/0102231 A1 * | 5/2011 | Matsumoto et al. | 342/1 |

FOREIGN PATENT DOCUMENTS

| | | | |
|---|---|---|---|
| EP | 0 903 371 A1 | 3/1999 | |
| EP | 1 052 654 A1 | 11/2000 | |
| EP | 1 359 676 A1 | 11/2003 | |
| EP | 1 542 509 A1 | 6/2005 | |
| EP | 2 131 642 A1 | 12/2009 | |
| JP | 61-32686 A | 2/1986 | |
| JP | 5-121155 A | 5/1993 | |
| JP | 5-191319 A | 7/1993 | |
| JP | 5-347180 A | 12/1993 | |
| JP | 6-5357 A | 1/1994 | |
| JP | 7-212835 A | 8/1995 | |
| JP | 08-239513 A | 9/1996 | |
| JP | 08-274493 A | 10/1996 | |
| JP | 9-31402 A | 2/1997 | |
| JP | 9-324128 A | 12/1997 | |
| JP | 11-177275 A | 7/1999 | |
| JP | 11-274843 A | 10/1999 | |
| JP | 11-339944 A | 12/1999 | |
| JP | 2000-097878 | 4/2000 | |
| JP | 2000-269715 A | 9/2000 | |
| JP | 2000-357419 A | 12/2000 | |
| JP | 2001-136082 A | 5/2001 | |
| JP | 2002-232316 A | 8/2002 | |
| JP | 2002-309107 A | 10/2002 | |
| JP | 2002309107 * | 10/2002 | C08L 101/00 |
| JP | 2003-59341 A | 2/2003 | |
| JP | 2003-105108 A | 4/2003 | |
| JP | 2003-272065 A | 9/2003 | |
| JP | 2003-273569 A | 9/2003 | |
| JP | 2004-135902 A | 5/2004 | |
| JP | 2004-153807 A | 5/2004 | |
| JP | 2004-294206 A | 10/2004 | |
| JP | 2004-296758 A | 10/2004 | |
| JP | 2005-317945 A | 11/2005 | |
| WO | 03/016048 A1 | 2/2003 | |
| WO | WO-2004/016047 A1 | 2/2004 | |

OTHER PUBLICATIONS

European Office Action, dated May 13, 2013, issued for EP Application No. 05816782.6.

Notice of Reasons for Refusal issued Jul. 20, 2010 in Japanese Application No. 2006-548843.

Extended European Search Report dated Feb. 6, 2012, for Application No. 05816782.6.

Notice of Reasons for Refusal for Japanese Patent Application No. 2006-548844, mailed on May 22, 2012.

* cited by examiner

DIELECTRIC RAW MATERIAL, ANTENNA DEVICE, PORTABLE PHONE AND ELECTROMAGNETIC WAVE SHIELDING BODY

TECHNICAL FIELD

The present invention relates to a dielectric raw material, an antenna device, a portable phone and an electromagnetic wave shielding body, particularly to a dielectric material having a high permittivity, and an antenna device, a portable phone and an electromagnetic wave shielding body which utilizes the dielectric raw material.

BACKGROUND ART

Conventionally, portable phones have been demanded to be small in weight, thickness and size, and there has been a request for a technology for reducing the weight, thickness and size of portable phones. On the other hand, there has been a request for an enhanced antenna radiation efficiency. In order to meet these requests, for example, Patent Document 1 discloses a technology relating to a portable phone enhanced in antenna radiation efficiency without spoiling lightness in weight or compactness. In addition, Patent Documents 2 to 4, for example, disclose technologies for enhancing the antenna radiation efficiency of portable phones.

Patent Document 1: Japanese Patent Laid-open No. 2004-153807
Patent Document 2: Japanese Patent Laid-open No. Hei 11-274843
Patent Document 3: Japanese Patent Laid-open No. Hei 7-212835
Patent Document 4: Japanese Patent Laid-open No. 2000-269715

Recently, however, a more higher antenna radiation efficiency has been requested for further reducing the thickness of portable phones. In order to meet this request, it is necessary to develop a dielectric raw material with a further enhanced permittivity. However, an electromagnetic wave shielding body utilizing a dielectric raw material usually tends to be increased in weight when it is tried to enhance its magnetic permeability. Furthermore, recently, there has been an increasing demand for a portable phone with a built-in antenna body, along with the tendency toward a smaller size. In the case of a portable phone equipped with a built-in antenna device, a feeding point and an antenna body are located close to each other. A conventional sheet of magnetic material (electromagnetic wave controlling body), however, would lower the antenna radiation efficiency when disposed in the vicinity of the antenna body; therefore, it has been difficult to apply such a sheet to a built-in antenna device for a portable phone, for example.

Besides, in recent years, an increasing number of ferroconcrete apartment houses and the like have come to be fitted with electric cookers utilizing electromagnetic waves, in place of gas cooking stoves. Attendant on this trend, it is requested to develop an electromagnetic wave shielding body for shielding the human body from the electromagnetic waves generated by such an electric cooker at the time of cooking.

DISCLOSURE OF INVENTION

Problems to be Solved by the Invention

The present invention has been made in consideration of the above-mentioned circumstances, and an object of the present invention is to provide a dielectric raw material having a high permittivity. In addition, it is another object of the present invention to provide an antenna device which can be enhanced in antenna radiation efficiency, even when an electromagnetic wave shielding body is disposed in the vicinity of the antenna body, and which is useful as, especially, a built-in antenna device of a portable phone, by using the dielectric raw material is used as the electromagnetic wave shielding body. Besides, it is a further object of the present invention to provide a portable phone capable of being reduced in weight, thickness and size, further with an antenna radiation efficiency enhanced, by using an electromagnetic wave shielding body including the dielectric raw material. Furthermore, it is yet another object of the present invention to provide an electromagnetic wave shielding body which includes the dielectric raw material and which can effectively shield the electromagnetic waves generated, for example, from an electric cooker.

Means for Solving the Problems

The present inventors have made intensive and extensive investigations in order to attain the above objects. As a result of the investigations, it has been found out that, in the case of a dielectric raw material using a silicone rubber as a main constituent of a base material and containing carbons as a conductive material, when the carbons are contained in the silicone rubber base material in such a condition as to enhance the ratio of mutual contact of the carbons, conduction paths (carbon network) will be easily formed, the electrostatic capacity between the carbons is raised, whereby a dielectric raw material with an enhanced permittivity can be obtained, and it is possible to obtain a higher permittivity, as compared, for example, with the case where the same amounts of the carbons are evenly dispersed in the silicone rubber base material. As a result of further investigations made intensively and extensively, it has been found out that such a dielectric raw material permits the antenna radiation efficiency to be enhanced, even when it is disposed in the vicinity of the antenna body, for example. Based on the findings, the present invention has been completed.

According to the present invention, there is provided (1) a dielectric raw material having carbons dispersed in a silicone rubber base material containing a silicone rubber as a main material, wherein, in any one of 1) to 3) described below. The carbons are unevenly distributed in the silicone rubber base material or the carbons are contained with at least part of them contacting each other.

1) a dielectric raw material containing 150 to 300 parts by weight of the carbons per 100 parts by weight of the silicone rubber.

2) a dielectric raw material formed by crosslinking and molding a mixture of the silicone rubber in its non-crosslinked state, a non-crosslinked organic polymer and the carbons.

3) a dielectric raw material formed by combining and blending at least two kinds of the carbons having different shapes and selected from spherical carbon, flat carbon, carbon fiber with an aspect ratio of not more than 11, carbon nanotube and conductive carbon.

Here, preferably, the dielectric raw material as described in (1) above, has conduction paths generated in at least part of the surface of the dielectric raw material.

In addition, according to the present invention, there is provided (2) an antenna device including the dielectric raw material as described in (1) above. Here, preferably, the antenna device as described in (2) above is a built-in antenna device of a portable phone.

Furthermore, according to the present invention, there are provided (3) a portable phone equipped with an electromagnetic wave shielding body using the dielectric raw material as described in (1) above, and (4) an electromagnetic wave shielding body using the dielectric raw material as described in (1) above. Besides, preferably, the electromagnetic wave shielding body as described in (4) above is an electric cooker electromagnetic wave shielding body for shielding electromagnetic waves generated by an electric cooker.

Effects of the Invention

According to the dielectric raw material of the present invention, it is possible to obtain a dielectric raw material having a high permittivity, capable of being reduced in weight and capable of being provided with flame resistance. In addition, according to the antenna device of the present invention, it is possible to obtain an antenna device which can be enhanced in antenna radiation efficiency, even when an electromagnetic wave controlling body is disposed in the vicinity of an antenna body, and which is useful as, especially, a built-in antenna device of a portable phone. Further, according to the portable phone of the present invention, it is possible to obtain a portable phone which can be reduced in weight, thickness and size, and which, by enhancing the antenna radiation efficiency, can be prolonged in cell life and can be reduced in SAR value. Furthermore, according to the electromagnetic wave shielding body of the present invention, it is possible to obtain an electromagnetic wave shielding body which can effectively shield electromagnetic waves, and which, by effectively shielding the electromagnetic waves generated, for example, from an electric cooker, can protect the human body from the influence of the electromagnetic waves.

| Explanation of Symbols | |
|---|---|
| A, A', 12, 25: | dielectric raw material |
| 1: | base material |
| 2: | spherical carbon |
| 3: | conductive carbon (aggregate) |
| 4: | carbon nanotube |

| Explanation of Symbols | |
|---|---|
| 5: | built-in antenna device |
| 6: | portable phone |
| 30: | electromagnetic wave shielding body |
| 31: | electric cooker |

BEST MODE FOR CARRYING OUT THE INVENTION

Now, the present invention will be described more in detail below. The dielectric raw material according to the present invention is composed of any of the compositions described in 1) to 3) below, wherein the carbons are unevenly distributed in the silicone rubber base material containing a silicone rubber as a main material or the carbons are contained with at least part of them contacting each other, whereby, it is desirable that conduction paths are generated. Incidentally, the proportion of the carbons unevenly distributed or contacting each other is not particularly limited. In consideration of the effects of the present invention arising from the carbons unevenly distributed or contacting each other, however, the amount of the carbons unevenly distributed or contacting each other is desirably not less than about ¼ times, preferably not less than about ⅓ times, more preferably not less than about ½ times, the total amount (weight ratio) of the carbons contained. For example, when the dielectric raw material of the present invention is observed under a transmission electron microscope, the area where the carbons are contacting each other or the carbons are unevenly distributed in the electron micrograph is suitably not less than about ¼ times, preferably not less than about ⅓ times, more preferably not less than about ½ times, the whole area of the electron micrograph.

1) A dielectric raw material containing 150 to 300 parts by weight of the carbons per 100 parts by weight of the silicone rubber.

2) A dielectric raw material formed by crosslinking and molding a mixture of the silicone rubber in its non-crosslinked state, a non-crosslinked organic polymer and the carbons.

3) A dielectric raw material formed by combining and blending at least two kinds of the carbons having different shapes and selected from spherical carbon, flat carbon, carbon fiber with an aspect ratio of not more than 11, carbon nanotube and conductive carbon.

Figure 1:
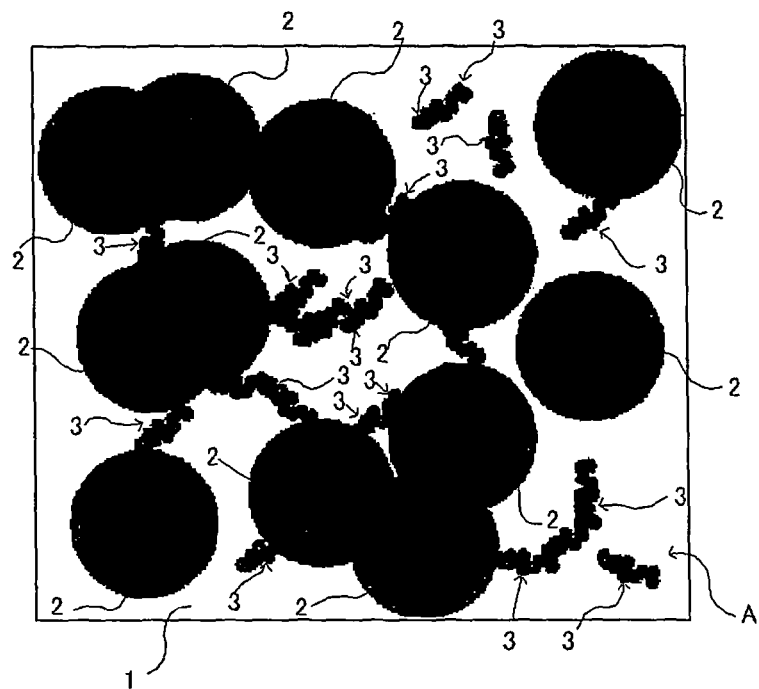
FIG. 1 is a schematic diagram illustrating the configuration of a dielectric raw material according to the present invention.

Here, in the case of the dielectric raw material according to the present invention, the dielectric raw material has carbons dispersed in a silicone rubber base material and is any of 1) to 3) above, wherein the carbons in the base material are contacting each other or unevenly distributed. Further, as above-mentioned, it is desirable that conduction paths (carbon network) are generated in at least part of the surface of the dielectric raw material. The condition where the conduction paths are generated in the surface of the dielectric raw material will be described more in detail, referring to the drawings. FIG. 1 schematically shows the image upon observation under an electron microscope of the surface of a dielectric raw material, as an example of the dielectric raw material of 3) above, which is obtained by combining a true-spherical carbon with an average particle diameter of about 10 μm as a spherical carbon and Ketchen black with a primary particle diameter of about 35 nm as a conductive carbon. In FIG. 1, symbol A denotes the dielectric raw material, 1 denotes a base material, 2 denotes the spherical carbon, and 3 denotes a conductive carbon aggregate formed by aggregation of the conductive carbon; in the case of FIG. 2, symbol A' denotes a dielectric raw material, 1 and 3 are the same as in FIG. 1, and 4 denotes a carbon nanotube. In the case of the dielectric raw material A shown in FIG. 1, the surface of the dielectric raw material A is in the condition where the spherical carbon 2 as large carbon is unevenly distributed in the base material 1, with part thereof contacting each other or separate from each other. In the area where the spherical carbon 2 is separate from each other, conductive carbon aggregates 3 formed by aggregation of the conductive carbon as small carbon in linear shape are connecting the separate parts of the spherical carbon 2 to each other, so that conduction paths due to contact between the carbons are generated at least in the surface of the dielectric raw material A.

Figure 2:
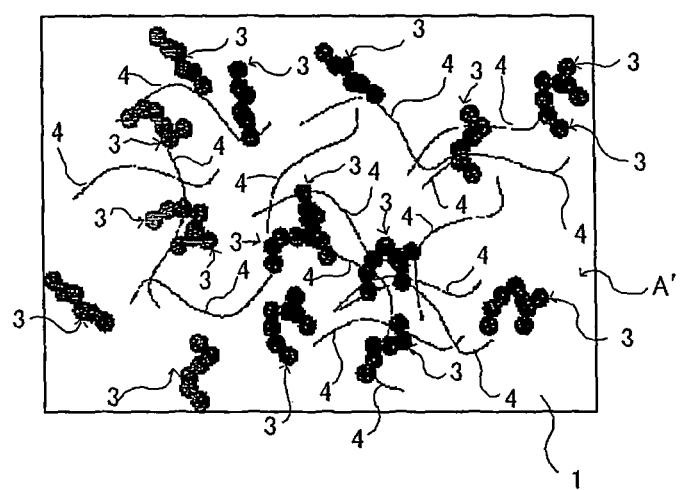
FIG. 2 is a schematic diagram illustrating the configuration of the dielectric raw material according to the present invention.

Besides, the surface of the dielectric raw material A' shown in FIG. 2 is in the condition where the carbon nanotube 4 as fibrous carbon material is unevenly distributed in a base material 1, with part thereof contacting each other or separate from each other. In the area where the carbon nanotube 4 is separate from each other, conductive carbon aggregates 3 formed by aggregation of the conductive carbon in linear shape are connecting the separate parts of the carbon nanotube 4. In the case of the dielectric raw material A', also, conduction paths due to contact between the carbons are generated at least in the surface thereof. Incidentally, the conduction paths may naturally be generated not only in the surface but also in the inside of the dielectric raw material. In addition, the proportion of the area where the conduction paths are generated in the surface of the dielectric raw material is not particularly limited. In consideration of the effects of the generation of the conduction paths, however, it is desirable that the conduction paths are generated in an area of not less than about ¼ times, preferably not less than about ⅓ times, more preferably not less than about ½ times, the surface area of the dielectric raw material.

Here, the silicone rubber used as a main material of the silicone rubber base material in the present invention is not particularly limited in kind. Examples of the silicone rubbers which can be suitably used include commercially available ones of methylvinylsilicone rubber, methylphenylvinylsilicone rubber, fluorosilicone rubber, etc., which may be used either singly or in appropriate combination of two or more of them. Besides, the silicone rubber base material in the present invention may not only contain the silicone rubber and, in the case of the dielectric raw material of 2) above, the organic polymer (described later) and the carbons but also contain, added thereto, for example, a foaming agent and a substance which will be extracted with a solvent after molding. The addition of a foaming agent or the addition of a substance to be extracted with a solvent after molding makes it possible to obtain a lighter dielectric raw material. Examples of the foaming agent which can be used include volatile-type foaming agents such as carbon dioxide gas, ammonia gas, etc., decomposition-type foaming agents such as azodicarbondiamide, dinitrosopentamethylenetetramine, etc., organic balloons, inorganic balloons, etc. In addition, usable examples of the substance to be extracted with a solvent after molding include sodium chloride, pentaerythritol, etc. in the case where water is used as the solvent. In consideration of uniformity and stability in the base material, however, expanded organic balloons or inorganic balloons can be used preferably. In the case of adding the expanded organic balloons or inorganic balloons, the addition amount is not particularly limited, and may be appropriately selected according, for example, to the desired specific gravity of the dielectric raw material. Taking into account the processability, the strength of the molded body and the like, however, the addition amount of the organic balloon is preferably not more than five parts by weight, more preferably one to five parts by weight, per 100 parts by weight of the silicone rubber. In the case of the inorganic balloon, the addition amount is preferably not more than 25 parts by weight, more preferably 5 to 25 parts by weight. Naturally, both the organic and inorganic balloons may be used in combination. Incidentally, for vulcanization of the silicone rubber, not only an organic peroxide but also vulcanizing methods utilizing radiations or an addition reaction may be used. Particularly, the method utilizing an addition reaction may be conducted by adding hydrogenpolysiloxane as a crosslinking agent, a platinum complex as a catalyst, and methylvinylcyclotetrasiloxane, acetylene alcohol or the like as a reaction inhibitor in small amounts, whereby a good molded body can be obtained and the molded body can be obtained even at a low temperature. Besides, silicone polymers generally are commercialized in the state of being loaded with silica, and such a silicone compound may also be used suitably.

As the carbons in the dielectric raw materials of 1) and 2) above in the present invention, it is desirable to use a graphite powder, graphite fibers or the like having a specific gravity of not less than two. These materials have been graphitized considerably and have been reduced in the number of reactive groups present in the carbon surfaces, so that they are highly compatible with silicone rubber. Besides, graphite has a high tendency toward aggregation, so that it is liable to be unevenly distributed in the silicone rubber. Further, since graphite is higher than general carbon in specific gravity, the loading amount thereof can be increased, and a dielectric raw material with a higher permittivity can be obtained. On the other hand, the carbon material which has been graphitized ultimately is the carbon nanotube, and it is high in electroconductivity, so that it will naturally display its effect even when used in a small amount. Furthermore, conductive carbon having been developed in structure is also preferable. Specifically, the carbons mentioned in the dielectric raw material of 3) described later are used more preferably.

The dielectric raw material of 1) above in the present invention has the carbons blended in an amount of 150 to 300 parts by weight per 100 parts by weight of the silicone rubber. When the polymer base material is loaded with a large amount of the carbons, the possibility of mutual contact of the carbons is increased, resulting in that the conduction paths are formed more easily. Besides, since the affinity of the silicone rubber for the carbons is weak even in the polymer compound used as a material of the dielectric raw material, an addition of an excess of carbons to the uncrosslinked silicone rubber ensures that the carbons are not entirely dispersed in the silicone rubber, and part of the carbons is agglomerated, to be present in an unevenly distributed state. By crosslinking and molding this material, therefore, it is ensured that part of the carbons contact each other or are unevenly distributed in the silicone rubber base material, whereby permittivity can be enhanced. Simultaneously, the insulating part of the silicone rubber can also be made to behave like a semiconductor, and a dielectric raw material with a high permittivity can be obtained. Therefore, in the case of the dielectric raw material of 1) above, it can have a very high permittivity, though it is increased in specific gravity; accordingly, it is possible to obtain a dielectric raw material which has a high permittivity even when reduced in thickness, for example. In addition, as compared for example with a dielectric raw material loaded with a small amount of carbons, the dielectric raw material of 1) above which has been highly loaded with the carbons shows a permittivity remarkably enhanced in view of the proportion in which the amount of the carbons is increased to attain a high loading amount thereof.

In the case of the dielectric raw material of 1) above, the blending amount of the carbons per 100 parts by weight of the silicone rubber is 150 to 300 parts by weight, preferably 200 to 300 parts by weight. If the loading proportion of the carbons is too high, it is difficult to process the mixture, whereas if the loading proportion is too low, the desired permittivity in the present invention cannot be obtained.

The dielectric raw material of 2) above according to the present invention is formed by crosslinking and molding a mixture containing the silicone rubber in the uncrosslinked state, an uncrosslinked organic polymer and the carbons. In the case of the mixture containing the uncrosslinked silicone rubber, the uncrosslinked organic polymer and the carbons, the affinity between the carbons and the organic polymer is higher than the affinity between the carbons and the silicone rubber, so that the carbons are in the state of being present preferentially in the organic polymer. By crosslinking and molding the mixture, there is obtained a dielectric raw material being high in the concentration of the carbons and having the carbons contacting each other or unevenly distributed. In addition, conduction paths are generated, whereby a higher permittivity can be obtained with the same addition amount of the carbons.

In the case of 2) above, usable examples of the organic polymer mixed in the silicone rubber include rubbers other than the silicone rubber, and thermoplastic elastomers, thermoset reins, etc., preferably rubbers, more preferably liquid rubbers such as liquid NBR, liquid EP, polybutene, etc. When the just-mentioned liquid rubber is used as the organic polymer to be mixed, the liquid rubber functions also as a plasticizer, whereby the loading amount of the carbons can be increased. In the case of mixing an organic polymer in the silicone rubber, the blending proportion of the organic polymer is not particularly limited, and can be appropriately selected according to the kind of the organic polymer or the like factors. The amount of the organic polymer is preferably 1 to 15 parts by weight, more preferably 3 to 10 parts by weight, per 100 parts by weight of the silicone rubber. If the blending proportion of the organic polymer is too high, the permittivity may be lowered, whereas if the blending proportion is too low, it may be difficult to obtain the effect of the blending of the organic polymer.

In the case of 2) above, the amount of the carbons blended in the silicone rubber base material is not particularly limited. The blending amount is preferably 3 to 300 parts by weight, more preferably 5 to 250 parts by weight, further preferably 10 to 200 parts by weight, per 100 parts by weight of the silicone rubber. If the addition amount of the carbons is large, the mixture may be difficult to process, whereas if the addition amount is too small, the desired permittivity may be difficult to obtain.

In the dielectric raw material of 3) above according to the present invention, the carbons are obtained by combining at least two carbons having different shapes and selected from spherical carbon, flat carbon, carbon fiber with an aspect ratio of not more than 11, carbon nanotube, and conductive carbon. In the case of adding the at least two kinds of specified carbons differing in shape and thereby using, for example, large graphite carbon (e.g., spherical carbon, flat carbon or the like with an average particle diameter of the order of a few micrometers to several tens of micrometers), fibrous carbon material (carbon fiber with an aspect ratio of not more than 11, carbon nanotube or the like) and small conductive carbon in combination, the small conductive carbon is present as links between the large particles of the graphite carbons or the fibrous carbon material, whereby there is obtained a dielectric raw material having carbons present in the silicone rubber base material, with part of the carbons contacting each other. With the conductive carbon thus present as links, conduction paths are formed, and it is possible to obtain a synergistic enhancing effect on permittivity, which cannot be obtained when only one kind of carbon is used.

Here, examples of the spherical carbon include the spherical graphite which is obtained by subjecting coal pitch carbon called mesophase globules to a heat treatment and which is called mesocarbon microbeads. Usable examples of the spherical carbon other than mesocarbon microbeads include various spherical carbons commercialized in the names of spherical carbon, spherical graphite, true-spherical carbon, true-spherical graphite, etc. Examples of the flat carbon include scaly graphite, laminar natural graphite, etc. which are described in, for example, Patent Document 5. Examples of the carbon fiber with an aspect ratio of not more than 11 include pitch-derived carbon fiber, PAN carbon fiber, etc. Incidentally, the preferable range of the aspect ratio is 3 to 11. If the aspect ratio is too high, dispersion may be easily generated in the unevenly distributed state or in the proportion of contact. Incidentally, if the aspect ratio is too low, the carbon cannot be called carbon fiber in practice. The carbon nanotube may be any carbon that has a structure obtained or as if obtained by rounding a graphene sheet (independent hexagonal network plane of carbon), and examples thereof include single wall nanotube (SWNT), multiwall nanotube (MWNT), and cup stack nanotube.

Patent Document 5: Japanese Patent Laid-open No. 2003-105108

The conductive carbon is carbons capable of providing conductivity in a polymer matrix with a smaller addition amount, as compared with general carbons, and is controlled in physical properties such as structure, porosity, primary particle diameter, etc. Examples of values indicating the development degree of structure include DBP oil absorption and BET specific surface area; when conductive carbon high in these values is used, conductivity can be imparted with a smaller addition amount. Specifically, the conductive carbon in the present invention has a DBP oil absorption of preferably not less then 100 $cm^3$/100 g, more preferably not less than 160 $cm^3$/100 g, and further preferably not less than 360 $cm^3$/100 g. If the DBP oil absorption is too low, the development degree of structure may be insufficient, and the conductivity is so low that the desired high permittivity in the present invention may be difficult to obtain. Although the upper limit of the preferable DBP oil absorption is not particularly limited, it is preferable for the DBP oil absorption to be not more than 700 $cm^3$/100 g, in consideration of the possibility that the structure might be broken upon dispersion of the conductive carbon into the polymer material. Incidentally, the DBP oil absorption can be measured according to ASTM D 2414-79. In addition, the BET specific surface area of the conductive carbon is preferably not less than 30 $m^2$/g, more preferably not less than 65 $m^2$/g, and further preferably not less than 800 $m^2$/g. The BET specific surface area is a factor determining the conductivity, together with the structure. If the BET specific surface area is too small, the conductivity of the conductive carbon particles alone cannot be enhanced, and the high permittivity desired in the present invention may be difficult to obtain. The upper limit of the preferable specific surface area is not particularly limited, but it is preferable for the specific surface area to be not more than 3000 $m^2$/g, taking surface stability into account. Specific examples of such conductive carbon include those commercially available under the names of Ketchen black, acetylene black, etc.

In the case where at least two kinds of carbons with different shapes are jointly used in the dielectric raw material of 3) above, it is preferable to use a combination of the abovementioned graphite carbon, especially spherical carbon with a specific gravity of not less than two, flat carbon, carbon fiber with an aspect ratio of not more than 11, or carbon nanotube, as a main ingredient, with other carbons. Among others, a combination of the graphite carbon with the conductive carbon is more preferable. The graphite carbon such as spherical carbon, flat carbon, carbon fiber with an aspect ratio of not less than 11, carbon nanotube, etc. has been graphitized to a high extent, so that it has a reduced number of reactive groups in the carbon surface, as above-mentioned. Therefore, the graphite carbon has a low affinity for the silicone rubber, and graphite has a strong tendency toward aggregation, so that it is liable to be unevenly distributed. In addition, the loading amount of graphite can be increased, since its specific gravity is higher than those of general carbons. As has been abovementioned, when the graphite carbon and the conductive carbon are used jointly, the conductive carbon is dispersed between the particles of the graphite carbon unevenly distributed, resulting in the condition where the carbons are linked to each other. This makes it possible to obtain a higher permittivity, as compared with the case where one of these carbons is used singly and uniformly dispersed in the base material.

Further, in the case of jointly using at least two kinds of carbons having different shapes, mixing thereof becomes easier and a higher loading can be achieved as, for example, the shape of the larger-particle carbon approaches the spherical shape. In view of this, the spherical carbon is preferred among the graphite carbons (spherical carbon, flat carbon, and carbon fiber with an aspect ratio of not more than 11), and the carbons called true-spherical graphite and true-spherical carbon are particularly preferred among the spherical carbons. Besides, among the carbon fiber and the carbon nanotube which are fibrous carbon materials, the carbon nanotube has a hollow cylindrical structure obtained or as if obtained by rounding graphene sheet (independent hexagonal network plane of carbon), as above-mentioned, and, therefore, the carbon nanotube is uniform in structure, high in conductivity, and capable of forming a conductive network more easily than the carbon fiber. Accordingly, the carbon nanotube is preferred among the fibrous carbon materials.

Furthermore, in the case of using at least two kinds of carbons having different shapes in the dielectric raw material of 3) above, it is preferable that at least one kind of the two kinds of carbons is conductive carbon or carbon nanotube, whereby it is possible to obtain more easily a dielectric raw material with a light weight and a high permittivity as desired in the present invention. In addition, as the graphite carbon to be combined with the conductive carbon or carbon nanotube, spherical carbon is preferred, as above-mentioned. Among the spherical carbons, particularly preferred are those called true-spherical graphite and true-spherical carbon. Besides, since the carbon nanotube is small in diameter (for example, even in the case of MWNT, the diameter is usually about 20 to 60 nm) and high-frequency electromagnetic waves flow only on the surface of a conductive substance, it is preferable to use the carbon nanotube jointly with conductive carbon having a large surface area.

In the case where at least two kinds of specific carbons differing in shape are thus used, the blending proportions of them are not particularly limited, and can be appropriately selected. For example, in the case of jointly using the graphite carbon (exclusive of carbon nanotube) and the conductive carbon, the amount of the graphite carbon (exclusive of carbon nanotube) in the total amount (100 wt. %) of the carbons is preferably 50 to 99 wt. %, and the amount of the conductive carbon is preferably 1 to 50 wt. %. In the case of jointly using the conductive carbon and the carbon nanotube, the amount of the carbon nanotube in the total amount (100 wt. %) of the carbons is preferably 1 to 99 wt. %, and the amount of the conductive carbon is preferably 1 to 99 wt. %. Further, in the case of jointly using the carbon nanotube and the graphite carbon (exclusive of carbon nanotube), the amount of the carbon nanotube in the total amount (100 wt. %) of the carbons is preferably 0.5 to 95 wt. %, and the amount of the graphite carbon (exclusive of carbon nanotube) is preferably 5 to 99.5 wt. %.

In the case of using at least two kinds of specific carbons differing in shape, the blending amount of the carbons in the dielectric raw material is not particularly limited, and can be appropriately selected. The blending amount of the carbons per 100 parts by weight of the silicone rubber is preferably 5 to 250 parts by weight, more preferably 10 to 220 parts by weight. If the total amount of the carbons is too large, the mixture may be difficult to process, whereas if the total amount is too small, the desired permittivity may be difficult to obtain.

The dielectric raw material according to the present invention may further contain, as other component than the above-described, for example a metal (aluminum, silver, etc.), a metal oxide, a metal hydroxide or the like added to the silicone rubber base material. By the addition of these components, thermal conductivity and/or flame resistance is imparted to the dielectric raw material. Furthermore, a plasticizer and a processing assistant may also be added. By the addition of these agents, processability of the dielectric raw material is improved. Examples of the plasticizer and processing assistant include silicone oil, etc.

The shape of the dielectric raw material according to the present invention is not particularly limited. Examples of the shape include sheet, cap, holder, block, etc., from which a suitable shape can be selected according to the use of the dielectric raw material.

The dielectric raw material according to the present invention is not particularly limited in regard of its relative permittivity, electric power radiated toward the human body side, or the like. For example, the relative permittivity can be appropriately selected within a preferable range according to the use of the dielectric raw material. For example, in the case of a portable phone (900 MHz), for example, in the case where the dielectric raw material is a 1 mm-thick sheet, it is preferable that the value $\in_r'$ of the real part of the complex relative permittivity $\in_r$ is not less then 100, preferably not less than 150, further preferably not less than 200, and still further preferably not less than 350, and that the value $\in_r''$ of the imaginary part is not less than 100, preferably not less then 150, further preferably not less then 300, and still further preferably not less than 700. If these values are too small, the enhancing effect on antenna radiation efficiency intended in the present invention may be difficult to obtain, and the reduction in the electric power radiated toward the human body side may be difficult to achieve. In the case where the dielectric raw material of the present invention is utilized as an electromagnetic wave shielding body of a portable phone, it is desirable that the power radiated toward the human body side is less. In view of this, if the electromagnetic wave shielding body using the dielectric raw material of the present invention is mounted, for example, to a whip antenna of a portable phone in which the antenna device is not of a built-in type, it is favorable that the power radiated toward the human body side can be reduced by not less than 80%, under the stored condition (non-drawn-out condition) of the whip antenna. On the other hand, in the case where the electromagnetic wave shielding body is mounted to a built-in antenna of a portable phone, as in the embodiment described later, it is desirable that the power radiated toward the human body side can be reduced by not less than 80%. Incidentally, where the value of the real part is not less than 200, the power radiated toward the human body side is reduced to 20% or below, even if the value of the imaginary part is not less than 100, and the radiation efficiency is thus enhanced. Besides, where the value of the imaginary part is not less than 350, the power radiated toward the human body side is reduced to 20% or below, even if the value of the real part is not more than 100, and the radiation efficiency is thus enhanced.

Incidentally, the preferable relative permittivity of the dielectric raw material of the present invention as above-mentioned pertains to the case where the sheet-formed dielectric raw material is 1 mm in thickness. In the case of a smaller thickness, a higher relative permittivity is desirable. When mounted to one of the devices which will be described later or the like, the dielectric raw material (electromagnetic wave shielding body) is more desirable as it is thinner. Therefore, when a dielectric raw material has a high permittivity, like the dielectric raw material of the present invention, the dielectric raw material can control electromagnetic waves sufficiently even if it is thin. For example, in the case where a dielectric raw material in the form of a 0.5 mm-thick sheet is used as a dielectric raw material of an electromagnetic wave shielding body to be mounted to a portable phone in which the antenna device is not of a built-in type, if only the value of the real part of the complex relative permittivity of the 0.5 mm-thick sheet-formed dielectric raw material is not less than 500, sufficient control of electromagnetic waves can be achieved even if the value of the imaginary part is small.

The dielectric raw material according to the present invention is not particularly limited as to physical properties. Since too large a specific gravity makes it difficult to achieve a reduction in weight intended in the present invention, however, the specific gravity is desirably not more than three, in any case of the dielectric raw materials of 1), 2) and 3) above.

The dielectric raw material according to the present invention is not particularly limited in regard of the producing method thereof. For example, the dielectric raw material can be formed by a method in which a curing agent, carbons and, if required, other ingredients are added to a silicone rubber serving as a main material of a silicone rubber base material and, in the case of the dielectric raw material of 2) above, an organic polymer, the admixture is mixed by use of rolls, a kneader or the like, and the resulting mixture is molded by a general polymer material molding method. It is to be noted here that, in the case of the present invention, it is desirable to control the mixing conditions (the number of stirring steps, the stirring force, the mixing time, etc.) so as not to mix in excess and so as to keep constant the mixing conditions for securing homogeneity of the product. Examples of the general molding method which can be used include moldings using a mold or molds, such as press molding, injection molding, transfer molding, etc., extrusion molding, calendaring, etc., and when the material is liquid, potting, casting, screen printing, etc.

The dielectric raw material according to the present invention is not particularly limited as to the use thereof. For example, the dielectric raw material can be used suitably as an electromagnetic wave controlling body for use in antenna devices of portable phones, automobiles (ETC, vehicle-to-vehicle distance measuring or controlling system, navigation system, radio, TV), portable TV sets, personal computer communications (Bluetooth), systems for transmission/reception of images such as small-type camera, etc., an electromagnetic wave shielding body for shielding electromagnetic waves, a material for human body phantoms used for measuring the influence of electromagnetic waves on the human body, a shielding apron for use with an electric cooker such as electromagnetic cookers (electromagnetic induction heating cookers), etc., an electromagnetic wave shielding body for use with an electric cooker, etc.

The antenna device according to the present invention has the above-described dielectric raw material, and it is preferable to use it particularly for a built-in antenna device of a portable phone, since the dielectric raw material of the present invention can be molded integrally with a metal-made or ceramic-made antenna body and can also be molded in accordance with the circuit design of a portable phone. Meanwhile, the antenna body of a built-in antenna device is curved or crooked, so that interference may be generated between portions of the antenna body. In this connection, the dielectric raw material according to the present invention can be disposed between the portions of the curved or crooked antenna body, whereby the interference between the portions of the antenna body can be suppressed, and the antenna radiation efficiency of the antenna device can be enhanced. Specifically, the absorption of radiated power into the human body can be suppressed. For example, the antenna radiation efficiency can be increased by a factor in the range of 1 to 1.7 folds. In addition, the antenna device of the present invention can be suitably used as a receiving antenna device or transmitting antenna device built in any of known small-type transmission/reception devices, such as a video recorder camera described in Patent Document 6 and the like, a transmission-reception device in a facility described in Patent Document 7, a small-type PDA described in Patent Document 8, a date display and a camera including the date display described in Patent Document 9, a monitor and a monitor system described in Patent Document 10, a micro-camera described in Patent Document 11 and the like.

Patent Document 6: Japanese Patent Laid-open No. Sho 61-32686
Patent Document 7: Japanese Patent Laid-open No. Hei 5-191319
Patent Document 8: Japanese Patent Laid-open No. 2001-136082
Patent Document 9: Japanese Patent Laid-open No. 2004-294206
Patent Document 10: Japanese Patent Laid-open No. 2003-272065
Patent Document 11: Japanese Patent Laid-open No. 2004-135902

The portable phone according to the present invention has an electromagnetic wave controlling body using the above-described dielectric raw material. As for the position at which to dispose the dielectric raw material (electromagnetic wave controlling body) in the portable phone, the dielectric raw material is disposed on the human body side. Here, the size, shape and the like of the electromagnetic wave controlling body are not particularly limited. Taking the demand for reductions in weight and size of the portable phone and the function as the electromagnetic wave controlling body into consideration, the size of the electromagnetic wave controlling body is desirably comparable to or greater than the area of the surface (the surface facing the human body) of the antenna. Taking the demand for reductions in weight and thickness of the portable phone into consideration, the thickness of the electromagnetic wave controlling body is preferably not more than about 2 mm, more preferably not more than about 1 mm, and further preferably not more than about 0.5 mm. For prevention of leakage of electromagnetic waves, a smaller thickness is better, and, therefore, there is no particular limit to the thickness. In consideration of the handleability and moldability as a molded body and the like factors, however, the thickness is preferably not less than 0.2 mm. The dielectric raw material, when thus used as an electromagnetic wave controlling body in a portable phone, can reduce the SAR value.

The electromagnetic wave shielding body according to the present invention includes the above-described dielectric raw material. The dielectric raw material of the present invention has a high permittivity and, also, is excellent in electromagnetic wave shielding performance, so that it can be used also as an electromagnetic wave shielding body. Therefore, the electromagnetic wave shielding body according to the present invention can effectively shield electromagnetic waves, when used as an electric cooker electromagnetic wave shielding body for shielding the electromagnetic waves generated from an electric cooker. In the case of using the above-described electromagnetic raw material as an electric cooker electromagnetic wave shielding body, the position at which to dispose the electromagnetic wave shielding body is not particularly limited. In consideration of handleability and the like, however, it is preferable, for example, to mount the electromagnetic wave shielding body on the inside or the outside of the electric cooker so that the electromagnetic wave shielding body is interposed between an electromagnetic wave generating source of the electric cooker and the human body side of the electric cooker. Besides, in this case, the electromagnetic wave shielding body is not particularly limited in size, shape or the like, and such factors can be appropriately selected according to the size of the objective electric cooker and the like conditions. The size of the electromagnetic wave shielding body is desirably comparable to or greater than the area of the surface, facing the human body, of the electromagnetic wave generating source (electromagnetic wave generating unit), and is preferably so set as to surround the electromagnetic wave generating source in such a manner that the function of the electric cooker will not be spoiled, whereby the influence of leakage electromagnetic waves on the human body can be effectively prevented. As for the thickness of the electromagnetic wave shielding body, a greater thickness promises a better effect. In consideration of the space of the cooking appliance, however, the thickness is preferably not more than about 5 mm, particularly not more than about 3 mm. Incidentally, there is no upper limit to the thickness. In consideration of moldability of rubber, however, a thickness of not less than 0.2 mm is usually preferred. Incidentally, the electric cooker for which the electromagnetic wave shielding body of the present invention is utilized is not particularly limited in regard of configuration or kind thereof. For example, the electromagnetic wave shielding body can be preferably utilized for electric cookers such as electromagnetic induction heating cookers (electromagnetic cookers), electronic ranges, etc. For example, the electromagnetic induction heating cookers here include those of various configurations, such as the commercialized electromagnetic induction heating cookers and the electromagnetic induction heating cookers described respectively in Patent Documents 12 to 15 and the like.

Patent Document 12: Japanese Patent Laid-open No. Hei 11-339944

Patent Document 13: Japanese Patent Laid-open No. Hei 6-5357

Patent Document 14: Japanese Patent Laid-open No. Hei 5-347180

Patent Document 15: Japanese Patent Laid-open No. Hei 5-121155

EXAMPLES

Now, the present invention will be described specifically by showing Examples and Comparative Examples, but the invention is not to be limited to or by the Examples.

Example 1

To 100 pts.wt. (parts by weight) of a silicone rubber (DY32-152U, a product by Dow Corning Toray Co., Ltd.), were added 150 pts.wt. of true-spherical graphite (MCMB (10-28), a product by Osaka Gas Chemicals Co., Ltd.) and 3.5 pts.wt. of conductive carbon (Ketchen black EC600JD, a product by Lion Corporation; with a DBP absorption of 495 cm$^3$/100 g as measured according to ASTM D 2414-79, and a BET specific surface area of 1270 m$^2$/g, the same applies hereinafter), as carbons, and 1 part by weight of 2,5-dimethyl-2,5-(t-butyl)dihexane (RC-4(50P), a product by Dow Corning Toray Co., Ltd.) as a crosslinking agent. The admixture was mixed by open rolls, and was heat-cured under the conditions of 170° C. and 200 kgf/cm$^2$ for 10 min., to obtain a sheet-formed molded body (dielectric raw material) measuring 40×40×10 mm. Under the same conditions, a sheet-formed molded body (dielectric raw material) measuring 40×110×0.5 mm. The molded body measuring 40×40×10 mm was used for measurement of permittivity, and the molded body measuring 40×110×0.5 mm was used for measurement of alternative SAR value.

Comparative Example 1

To 100 pts.wt. of ethylenepropylenediene rubber (EP22, a product by JSR Corporation), were added 150 pts.wt. of true-spherical graphite (MCMB(10-28), a product by Osaka Gas Chemicals Co., Ltd.) and 3.5 pts.wt. of conductive carbon (Ketchen black EC600JD, a product by Lion Corporation), as carbons, 1 part by weight of stearic acid, 5 pts.wt. of zinc oxide, and 4.5 pts.wt. of 2,5-dimethyl-2,5-(t-butyl)dihexane (Perhexane 25B(40), a product by NOF CORPORATION). The admixture was mixed by open rolls, and the resulting mixture was heat-cured under the conditions of 170° C. and 200 kgf/cm$^2$ for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternative SAR value.

For the dielectric raw materials obtained in Example 1 and Comparative Example 1 above, permittivity was measured by use of a vector network analyzer (8720ES, a product by Agilent Technologies Inc.) and a dielectric probe set (85070C, a product by Agilent Technologies Inc.). The measurement results of complex relative permittivity of the dielectric material at 900 MHz are shown in Table 1. In addition, for the dielectric raw materials, alternate SAR value change rate was determined according to the method described in Patent Document 1. Further, specific gravity was measured, for the dielectric raw materials. The results are shown in Table 1. When the dielectric raw materials of Example 1 and Comparative Example 1 were observed under a transmission electron microscope, it was confirmed that in the dielectric raw material of Example 1, the carbons were contacting each other to generate conduction paths in about ⅓ of the surface area. On the other hand, in the dielectric raw material of Comparative Example 1, the carbons were rarely contacting each other. A dielectric raw material obtained in the same manner as in Example 1, except that the blending amount of the conductive carbon in Table 1 below was changed from 3.5 pts.wt. in Table 1 to 3 pts.wt. and the total blending amount was 254.0 pts.wt., was served to measurement of complex relative permittivity and alternate SAR value change rate in the same manner as in Example 1. As a result, the complex permittivity (900 MHz) was found to be 143-135j and the alternate SAR value change rate was −56.0%. Besides, a dielectric raw material obtained in the same manner as in Comparative Example 1, except that the blending amount of the conductive carbon was changed from 3.5 pts.wt. in Table 1 to 3 pts.wt. and the total blending amount was 263.5 pts.wt., was served to measurement of complex permittivity and alternate SAR value change rate in the same manner as in Comparative Example 1. As a result, the complex relative permittivity (900 MHz) was found to be 28-12j and the alternate SAR value change rate was −4.8%.

TABLE 1

| Name of Chemical | Example 1 | Comp. Ex. 1 |
| --- | --- | --- |
| Silicone rubber | 100 | 0 |
| 2,5-Dimethyl-2,5-(t-butyl)dihexane | 1.0 | 4.5 |
| Ethylenepropylenediene rubber | 0 | 100 |
| Stearic acid | 0 | 1.0 |
| ZnO | 0 | 5.0 |
| True-spherical graphite | 150 | 150 |
| Conductive carbon | 3.5 | 3.5 |
| Total (pts. wt.) | 254.5 | 264.0 |
| Complex relative permittivity (900 MHz) | 165-171 j | 56-58 j |
| Alternate SAR value change rate (%) | −60.0 | −5.2 |
| Specific gravity (g/cm³) | 1.591 | 1.432 |

Example 2

To 90 pts.wt.t of a silicone rubber (DY32-152U, a product by Dow Corning Toray Co., Ltd.) and 10 pts.wt. of a liquid ethylenepropylene rubber (Rucant HC2000, a product by Mitsui Chemicals, Inc.), were added 150 pts.wt. of true-spherical graphite (MCMB(10-28), a product by Osaka Gas Chemicals Co., Ltd.) and 3.5 pts.wt. of conductive carbon (Ketchen black EC600JD, a product by Lion Corporation), as carbons, and 1 part by weight of 2,5-dimethyl-2,5-(t-butyl)dihexane (RC-4(50P), a product by Dow Corning Toray Co., Ltd.) as a crosslinking agent. The admixture was mixed by open rolls, and the resulting mixture was heat-cured under the conditions of 170° C. and 200 kgf/cm² for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value.

For the dielectric raw materials obtained in Example 2, the complex relative permittivity of the dielectric material at 900 MHz, alternate SAR value change rate and specific gravity were measured in the same manner as in Example 1 above. The results are shown in Table 2, together with the results of Example 1. In addition, when the dielectric raw material of Example 2 was observed under a transmission electron microscope, it was confirmed that the carbons were contacting each other to form conduction paths in about ⅓ of the surface area. Incidentally, a dielectric raw material obtained in the same manner as in Example 2, except that the blending amount of the conductive carbon was changed from 3.5 pts.wt. in Table 2 to 3 pts.wt. and the total blending amount was 254.0 pts.wt., was served to measurement of complex relative permittivity and alternate SAR value change rate in the same manner as in Example 2. As a result, the complex relative permittivity (900 MHz) was found to be 160-140j, and the alternate SAR value change rate was −78.3%.

TABLE 2

| Name of Chemical | Example 2 | Example 1 |
| --- | --- | --- |
| Silicone rubber | 90 | 100 |
| Liquid ethylenepropylene rubber | 10 | 0 |
| 2,5-Dimethyl-2,5-(t-butyl)dihexane | 1.0 | 1.0 |
| True-spherical graphite | 150 | 150 |
| Conductive carbon | 3.5 | 3.5 |
| Total (pts. wt.) | 254.5 | 254.5 |
| Complex relative permittivity (900 MHz) | 189-205 j | 165-171 j |
| Alternate SAR value change rate (%) | −79.5 | −60.0 |
| Specific gravity (g/cm³) | 1.555 | 1.591 |

Example 3

To 100 pts.wt. of a low specific gravity silicone rubber (X-30-1777-50-U, a product by Shin-Etsu Chemical Co., Ltd.), were added 150 pts.wt. of true-spherical graphite (MCMB(10-28), a product by Osaka Gas Chemicals Co., Ltd.) and 3.5 pts.wt. of conductive carbon (Ketchen black EC600JD, a product by Lion Corporation), as carbons, and 1 part by weight of 2,5-dimethyl-2,5-(t-butyl)dihexane (RC-4 (50P), a product by Dow Corning Toray Co., Ltd.) as a crosslinking agent. The admixture was mixed by open rolls, and the resulting mixture was heat-cured under the conditions of 170° C. and 200 kgf/cm² for 10 min, to obtain a sheet-formed molded body (dielectric raw material) measuring 40×40×10 mm. Under the same conditions, a sheet-formed molded body (dielectric raw material) measuring 40×110× 0.5 mm was obtained. The molded body measuring 40×40× 10 mm was used for measurement of permittivity, and the molded body measuring 40×110×0.5 mm was used for measurement of alternate SAR value change rate.

For the dielectric raw materials obtained in Example 3, the complex relative permittivity of the dielectric material at 900 MHz, alternate SAR value change rate and specific gravity were measured in the same manner as in Example 1 above. The results are shown in Table 3, together with the results of Example 1. In addition, when the dielectric raw material obtained in Example 3 was observed under a transmission electron microscope, it was confirmed that the carbons were contacting each other to form conduction paths in about ⅓ of the surface area. Incidentally, a dielectric raw material obtained in the same manner as in Example 3, except that the blending amount of the conductive carbon was changed from 3.5 pts.wt. in Table 3 to 3 pts.wt. and the total blending amount was 254.0 pts.wt., was served to measurement of complex relative permittivity and alternate SAR value change rate in the same manner as in Example 3. As a result, the complex relative permittivity (900 MHz) was found to be 199-141j, and the alternate SAR value change rate was −93.2%.

TABLE 3

| Name of Chemical | Example 3 | Example 1 |
|---|---|---|
| Low specific gravity (foamed) Silicone rubber | 100 | 0 |
| Silicone rubber | 0 | 100 |
| 2,5-Dimethyl-2,5-(t-butyl)dihexane | 1.0 | 1.0 |
| True-spherical graphite | 150 | 150 |
| Conductive carbon | 3.5 | 3.5 |
| Total (pts. wt.) | 254.5 | 254.5 |
| Complex relative permittivity (900 MHz) | 230-193 j | 165-171 j |
| Alternate SAR value change rate (%) | −94.3 | −60.0 |
| Specific gravity (g/cm$^3$) | 1.360 | 1.591 |

Example 4

To 100 pts.wt. of a silicone rubber (DY32-152U, a product by Dow Corning Toray Co., Ltd.), were added 170 pts.wt. of true-spherical graphite (MCMB(10-28), a product by Osaka Gas Chemicals Co., Ltd.) and 10 pts.wt. of conductive carbon (Ketchen black EC600JD, a product by Lion Corporation), as carbons, and 1 part by weight of 2,5-dimethyl-2,5-(t-butyl)dihexane (RC-4(50P), a product by Dow Corning Toray Co., Ltd.) as a crosslinking agent. The admixture was mixed by open rolls, and the resulting mixture was heat-cured under the conditions of 170° C. and 200 kgf/cm$^2$ for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value change rate.

Example 5

To 100 pts.wt. of a silicone rubber (DY32-152U, a product by Dow Corning Toray Co., Ltd.), were added 200 pts.wt. of true-spherical graphite (MCMB(10-28), a product by Osaka Gas Chemicals Co., Ltd.) and 10 pts.wt. of conductive carbon (Ketchen black EC600JD, a product by Lion Corporation), as carbons, and 1 part by weight of 2,5-dimethyl-2,5-(t-butyl)dihexane (RC-4(50P), a product by Dow Corning Toray Co., Ltd.) as a crosslinking agent. The admixture was mixed by open rolls, and the resulting mixture was heat-cured under the conditions of 170° C. and 200 kgf/cm$^2$ for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value change rate.

Example 6

To 100 pts.wt. of a silicone rubber (DY32-152U, a product by Dow Corning Toray Co., Ltd.), were added 200 pts.wt. of artificial graphite (SGL12, a product by SEC; with a specific gravity of 2.21 g/cm$^3$) as carbon and 1 part by weight of 2,5-dimethyl-2,5-(t-butyl)dihexane (RC-4(50P), a product by Dow Corning Toray Co., Ltd.) as a crosslinking agent. The admixture was mixed by open rolls, and the resulting mixture was heat-cured under the conditions of 170° C. and 200 kgf/cm$^2$ for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value change rate.

Example 7

To 100 pts.wt. of a silicone rubber (DY32-152U, a product by Dow Corning Toray Co., Ltd.), were added 150 pts.wt. of laminar natural graphite (SNE6G, a product by SEC; with a specific gravity of 2.25 g/cm$^3$) as carbon and 1 part by weight of 2,5-dimethyl-2,5-(t-butyl)dihexane (RC-4(50P), a product by Dow Corning Toray Co., Ltd.) as a crosslinking agent. The admixture was mixed by open rolls, and the resulting mixture was heat-cured under the conditions of 170° C. and 200 kgf/cm$^2$ for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value change rate.

For the dielectric raw materials obtained in Examples 4 to 7, the complex relative permittivity of the dielectric material at 900 MHz, alternate SAR value change rate and specific gravity were measured in the same manner as in Example 1 above. The results are shown in Table 4. In addition, when the dielectric raw materials obtained in Examples 4 to 7 were observed under a transmission electron microscope, it was confirmed that the carbons were contacting each other to form conduction paths, in about ⅓ of the surface area of the dielectric raw material of Example 4, in about ½ of the surface area of the dielectric raw material of Example 5, in about ½ of the surface area of the dielectric raw material of Example 6, and in about ⅓ of the surface area of the dielectric raw material of Example 7.

TABLE 4

| Name of Chemical | Ex. 4 | Ex. 5 | Ex. 6 | Ex. 7 |
|---|---|---|---|---|
| Silicone rubber | 100 | 100 | 100 | 100 |
| 2,5-Dimethyl-2,5-(t-butyl)dihexane | 1.0 | 1.0 | 1.0 | 1.0 |
| True-spherical graphite | 170 | 200 | 0 | 0 |
| Artificial graphite | 0 | 0 | 200 | 0 |
| Laminar natural graphite | 0 | 0 | 0 | 150 |
| Conductive carbon | 10 | 10 | 0 | 0 |
| Total (pts. wt.) | 281 | 311 | 301 | 201 |
| Complex relative permittivity (900 MHz) | 1049-1221 j | 1451-1048 j | 1820-3.7 j | 650-720 j |
| Alternate SAR value change rate (%) | −91.1 | −88.4 | −90.0 | −90.0 |
| Specific gravity (g/cm$^3$) | 1.610 | 1.650 | 1.660 | 1.605 |

Example 8

To 100 pts.wt. of a silicone rubber (DY32-152U, a product by Dow Corning Toray Co., Ltd.), were added 10 pts.wt. of conductive carbon (Ketchen black EC600JD, a product by Lion Corporation) and 10 pts.wt. of carbon nanotube (MWNT, a product by Bussan Nanotech Research Institute Inc.), as carbons, 1.0 part by weight of a processing assistant (Alphaflex 101, a product by Alphaflex Industries), 1.0 part by weight of 2,5-dimethyl-2,5-(t-butyl)dihexane (RC-4

(50P), a product by Dow Corning Toray Co., Ltd.) as a crosslinking agent (peroxide curing agent), and 10 pts.wt. of a silicone oil (SH-200 50 cs, a product by Dow Corning Toray Co., Ltd.). The admixture was mixed by open rolls, and the resulting mixture was heat-cured under the conditions of 170° C. and 200 kgf/cm² for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value change rate.

For the dielectric raw materials obtained in Example 8, the complex relative permittivity of the dielectric material at 900 MHz, 1.5 GHz, 2.1 GHz, and 5.0 GHz, alternate SAR value change rate at 900 MHz and specific gravity were measured. The results are shown in Table 5. In addition, when the dielectric raw material of Example 8 was observed under a transmission electron microscope, it was confirmed that the carbons were contacting each other to form conduction paths in about ⅓ of the surface area.

TABLE 5

| Name of Chemical | Example 8 |
| --- | --- |
| Silicone rubber, DY32-152U | 100 |
| Processing assistant, Alphaflex 101 | 1.0 |
| Peroxide curing agent, RC-4(50 P) | 1.0 |
| Silicone oil, SH-200 50 cs | 10 |
| Carbon nanotube | 10 |
| Conductive carbon | 10 |
| Total (pts. wt.) | 132 |
| Value of real part of complex relative permittivity | |
| 0.9 GHz | 517 |
| 1.5 GHz | 353 |
| 2.1 GHz | 287 |
| 5.0 GHz | 209 |
| Value of imaginary part of complex relative permittivity | |
| 0.9 GHz | 1097 |
| 1.5 GHz | 714 |
| 2.1 GHz | 535 |
| 5.0 GHz | 255 |
| Altarnate SAR value change rate (%) | −92.1 |
| Specific gravity (g/cm³) | 1.180 |

Example 9

To 100 pts.wt. of a foam balloon-loaded silicone (X-30-1777-50U, a product by Shin-Etsu Chemical Co., Ltd.), were added 1.5 pts.wt. of carbon nanotube (MWNT, a product by Bussan Nanotech Research Institute Inc.) and 100 pts.wt. of true-spherical graphite (MCMB(10-28), a product by Osaka Gas Chemicals Co., Ltd.), as carbons, 1.0 part by weight of a processing assistant (Alphaflex 101, a product by Alphaflex Industries), 1.0 part by weight of a peroxide curing agent (C-8A, a product by Shin-Etsu Chemical Co., Ltd.), and 1.5 pts.wt. of a silicone oil (SH-200 50 cs, a product by Dow Corning Toray Co., Ltd.). The admixture was mixed by open rolls, and the resulting mixture was heat-cured under the conditions of 170° C. and 200 kgf/cm² for 10 min., to obtain a sheet-formed molded body (dielectric raw material) measuring 40×40×10 mm. Under the same conditions, a sheet-formed molded body (dielectric raw material) measuring 40×110×0.5 mm was obtained. The molded body measuring 40×40×10 mm was used for measurement of permittivity, and the molded body measuring 40×110×0.5 mm was used for measurement of alternate SAR value change rate.

For the dielectric raw materials obtained in Example 9, the complex relative permittivity of the dielectric material at 900 MHz, 1.5 GHz, 2.1 GHz, and 5.0 GHz, alternate SAR value change rate at 900 MHz and specific gravity were measured. The results are shown in Table 6. In addition, when the dielectric raw material of Example 9 was observed under a transmission electron microscope, it was confirmed that the carbons were contacting each other to form conduction paths in about ⅓ of the surface area.

TABLE 6

| Name of Chemical | Example 9 |
| --- | --- |
| Foam balloon-loaded silicone (X-30-1777-50U) | 100 |
| Processing assistant, Alphaflex 101 | 1.0 |
| Peroxide curing agent, C-8A | 1.0 |
| Silicone oil, SH-200 50 cs | 1.5 |
| Carbon nanotube | 1.5 |
| True-spherical graphite | 100 |
| Total (pts. wt.) | 205 |
| Value of real part of complex relative permittivity | |
| 0.9 GHz | 186 |
| 1.5 GHz | 135 |
| 2.1 GHz | 107 |
| 5.0 GHz | 61 |
| Value of imaginary part of complex relative permittivity | |
| 0.9 GHz | 139 |
| 1.5 GHz | 122 |
| 2.1 GHz | 108 |
| 5.0 GHz | 73 |
| Altarnate SAR value change rate (%) | −90.3 |
| Specific gravity (g/cm³) | 1.210 |

According to the results shown in Table 1 to 6 above, it is recognized that a high permittivity can be obtained by highly loading a silicone rubber with carbons. Besides, it is also recognized that, by using a silicone rubber as a base material, a higher permittivity can be obtained as compared with the case of using a general-purpose rubber as a base material, with the same amount of a filler (carbons). Further, it is recognized that, when a silicone rubber is mixed with an organic rubber material and carbons are added thereto, a higher permittivity can be obtained as compared with case of using the silicone rubber singly. Furthermore, a further higher permittivity can be obtained by combining carbon materials (carbons) having different shapes.

Example 10

Figure 3:
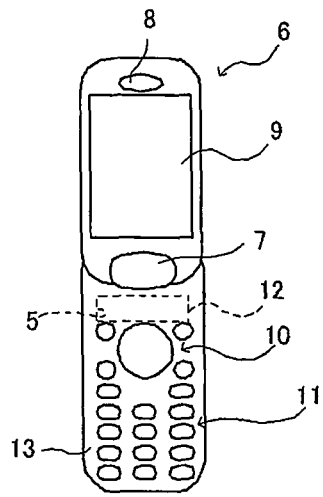
FIG. 3 is a schematic top plan view of a portable phone, for illustrating a configuration example of a built-in antenna device according to the present invention and an embodiment of a portable phone according to the present invention.

Now, a configuration example of the antenna device according to the present invention will be described below as Example 10, referring to FIG. 3. FIG. 3 is a schematic top plan view showing a portable phone 6 having a built-in antenna device 5 according to a configuration example of the present invention, in its opened condition. The portable phone 6 may be, for example, one which is commercially available. The portable phone shown in FIG. 3 is foldable at a hinge part 7 fitted also with a rotating mechanism, and it can be used in its opened condition at the time of talking; however, the configuration of the portable phone is not particularly limited. In the figure, symbol 8 denotes an ear piece, 9 denotes a display part, 10 denotes a menu control part, 11 denotes a dial operating part, 12 denotes a dielectric raw material, and 13 denotes a portable phone casing. The built-in antenna device 5 is mounted inside the portable phone casing 13, and its configuration is not particularly limited; for example, an antenna device incorporated in a commercially available portable phone can be utilized. The dielectric raw material 12 is a sheet-formed body having dimensions (vertical and lateral) approximate to those of the built-in antenna device 5, and disposed inside the portable phone casing 13 at a position on the front side of the built-in antenna device 5, namely, on an outside wall of the antenna device 5 so that the dielectric raw material 12 is located on the human body side when the portable phone is used. Incidentally, the configuration of the antenna device having the dielectric raw material of the present invention is not particularly limited. Other than the built-in antenna device as used in the portable phone 6 mentioned above, the antenna device of the present invention is applicable to various antenna devices of known various voice transmission/reception devices, picture transmission/reception devices, etc. For example, the antenna device according to the present invention can have a configuration in which the dielectric raw material of the invention is disposed on the human body side of any of these various antenna devices.

Example 11

In the next place, as an example of the portable phone according to the present invention, a portable phone of Example 11 was fabricated by adopting a configuration in which a sheet-formed dielectric raw material composed of the same composition as that in Example 4 above and having a vertical dimension of 5 mm, a lateral dimension of 30 mm and a thickness of 0.5 mm is disposed in a commercially available portable phone configured as shown in FIG. 3 so that the dielectric raw material is located on the human body side (front side) of the built-in antenna device. On the other hand, a portable phone of Comparative Example 2 was fabricated by adopting a configuration in which a commercially available magnetic sheet (a vertical dimension of 5 mm, a lateral dimension of 30 mm, and a thickness of 1 mm) containing a micrometer-order magnetic metal powder dispersed and mixed in a resin and having a specific gravity of 3.1 and a relative permittivity μr=60 (1 MHz) is disposed in a portable phone configured as shown in FIG. 3 so that the magnetic sheet is located on the human body side of the built-in antenna device. The portable phones of Example 11 and Comparative Example 2 were served to measurement of electric field intensity inside a human head phantom (solid) by use of an experimental equipment 14 shown in FIG. 4 and described in detail below in place of alternate SAR characteristics (alternate SAR value).

Figure 4:
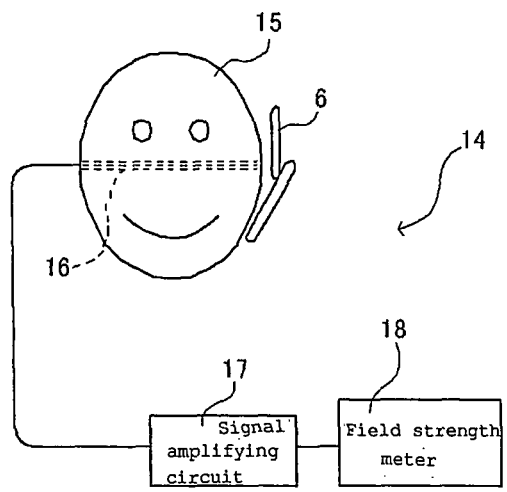
FIG. 4 is an illustration of an experimental system for measuring the alternative SAR value of the embodiment of the portable phone.

The experimental equipment shown in FIG. 4 is for measuring the field strength inside a human head phantom model 15 when a portable phone 6 is used. In the equipment, a SAR measuring antenna (micro-dipole three-axis type Δ beam antenna) 16 is inserted to a point where the field strength is considered to be the highest inside the human head phantom model 15, and the field strength is measured by a field strength meter (8808, a product by HIOKI E.E. CORPORATION) 18 through a signal amplifying circuit 17 (wide-band OP amplifier). At the time of measurement, the human head phantom model 15 is placed on a laboratory table (not shown) made of PS (polystyrene) foam and measuring 900×900× 1800 mm. Incidentally, the experimental equipment 14 shown in FIG. 4 is the same as the equipment used for determining the alternate SAR value change rate in Example 1 and the like.

By use of this experimental equipment, alternate SAR value was measured for the portable phones of Example 11 and Comparative Example 2. Further, alternate SAR value was measured for the portable phones from which the dielectric raw material had been removed, thereby determining the alternate SAR value change rate before and after the removal of the dielectric raw material. The alternate SAR value change rate was −53% for Example 11, and −23% for Comparative Example 2. Incidentally, the alternate SAR value change rate was tested for 40×110 mm dielectric raw material in Examples 1 to 9, whereas the dielectric raw material in Example 11 had a size approximate to the size of the built-in antenna in the portable phone; therefore, the reducing effect of the alternate SAR value change rate in Example 11 was smaller according to the smaller area of the dielectric raw material. According to these results, it is recognized that the portable phone of the present invention in which the dielectric raw material of the present invention is mounted as an electromagnetic wave controlling body is capable of reducing the SAR value, and its effect is greater than that in Comparative Example 2 in which a thicker dielectric raw material is mounted. Therefore, the portable phone according to the present invention is sufficiently reduced in SAR value, notwithstanding the small-thickness dielectric raw material is mounted therein as an electromagnetic wave controlling body; thus, the portable phone of the invention can satisfactorily meet the recent demands for reductions in the weight, thickness and size of portable phone. In addition, the portable phone of Example 11 uses the built-in antenna device of Example 10, and communications and conversation could be normally performed, notwithstanding the structure in which the dielectric raw material was disposed in the vicinity of the antenna.

Figure 5:
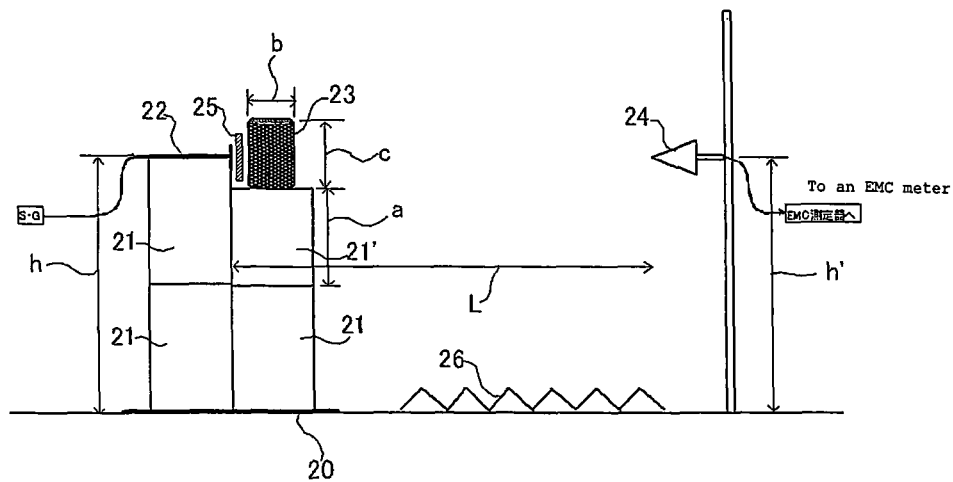
FIG. 5 is an illustration of an experimental system for examining variations in radiation pattern by a dielectric raw material used in the embodiment of the portable phone.

In the next place, by use of an experimental equipment shown in FIG. 5, variations in radiation pattern was examined, for a system in which a sheet-formed dielectric raw material composed of the same composition as that in Example 4 above and having a vertical dimension of 150 mm, a lateral dimension of 150 mm and a thickness of 0.5 mm is disposed between an antenna device and a human phantom model. The experimental equipment shown in FIG. 5 had a configuration in which polystyrene foams 21, 21 (500×500× 500 mm) are stacked on a rotatable stage 20, a transmission antenna (UHAP, a standard dipole antenna, produced by Schwarzbeck) 22 connected to a S.G. (signal generator 83732B, a synthesized signal generator, produced by Agilent Technologies Inc.; 900 MHz; 0 dBm) which is disposed in the outside of a radio wave dark room and mounted in a rack is mounted thereon, a polystyrene foam 21 (500×500×500 mm) is placed adjacently thereto, a polystyrene foam 21' with a height (arrows a in the figure) of 300 mm is stacked on this polystyrene foam 21, and a human phantom model (an adult head of 200 mm in diameter (arrows b in the figure)) 23 with a height (arrows c in the figure) of 400 mm is mounted on the polystyrene foam 21' so that the distance between the human phantom model 23 and the transmission antenna 22 is 20 mm. This ensures that the height of the center (in the height direction) of the human head phantom model 23 from the floor of the laboratory is equal to the height (arrows h in the figure: 1000 mm) of the transmission antenna 22. Incidentally, the dielectric raw material 25 is placed on the same polystyrene foam as for the phantom modem 23 in such a manner that the distance between itself and the transmission antenna 22 and the distance between itself and the phantom model 23 are both 10 mm, i.e., it is set at the midpoint between the transmission antenna 22 and the phantom model 23. Then, a reception antenna (radio wave dark room equipped type helical antenna) 24 connected to an EMC meter (8546A, receiver, produced by Agilent Technologies Inc.) which is disposed in the outside of a radio wave dark room and mounted in a rack is so set that the antenna distance (arrows L in the figure) is 1500 mm and the antenna height (arrows h' in the figure) is 1000 mm. Further, a floor electromagnetic wave absorber 26 is laid on the floor of the laboratory. In addition, since the antenna length of the transmission antenna 22 is about 167 mm, a 150×150 mm dielectric raw material 25 used as a sample was so placed that a diagonal of the dielectric raw material 25 coincides with the height direction of the transmission antenna 22 and that the antenna length of the transmission antenna 22 is hidden. Incidentally, the height of the phantom model was set to 400 mm, for the purpose of reducing the influence of diffracted waves coming from the perpendicular direction. Besides, the height of the transmission and reception antennas was set to 1000 mm, for the purpose of reducing the influence of reflected waves from the floor.

By use of the experimental equipment as above, the following measurements were carried out.

Measurement-1: While rotating the stage of the transmission antenna (standard dipole antenna) through 360 degrees in the condition where the phantom model is absent, the level of reception at the reception antenna is measured, and the field in 360° directions is monitored.

Measurement-2: While rotating the stage of the transmission antenna (standard dipole antenna) through 360 degrees in the condition where the phantom model is mounted on the stage, the level of reception at the reception antenna is measured, and the field in 360° directions is monitored in the condition where the phantom model is present.

Measurement-3: While rotating the stage with the dielectric raw material (sample) set thereon between the transmission antenna (standard dipole antenna) and the phantom model through 360 degrees, the level of reception at the reception antenna is measured, and the field in 360° directions is monitored.

Figure 6:
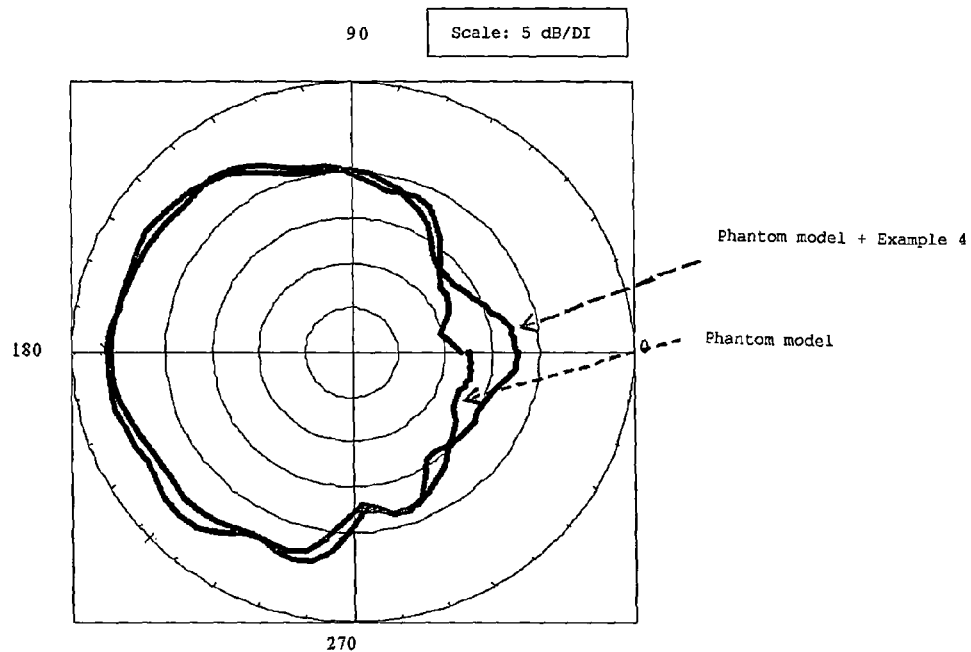
FIG. 6 shows a radiation pattern obtained by the measurement made by the experimental system.

Radiation patterns obtained by the above measurements (the measurement results of the level of reception at the reception antenna when the turntable with the transmission antenna, the phantom model and the dielectric raw material mounted thereon was rotated through 360 degrees) are shown in FIG. 6. From the radiation patterns in FIG. 6, it is recognized that, when the dielectric raw material formed of the same composition as in Example 4 was interposed between the transmission antenna and the human phantom model, the radiation pattern was enlarged and the radiation pattern from the transmission antenna was improved, as compared by the case where only the human phantom model was present near the transmission antenna. Incidentally, the configuration of the portable phone according to the present invention is not particularly limited. Other than the portable phone 6 as above-mentioned, a configuration in which the dielectric raw material of the present invention is disposed on the human body side of an antenna device in any of known various portable phones may also be adopted.

Example 12

Figure 7:
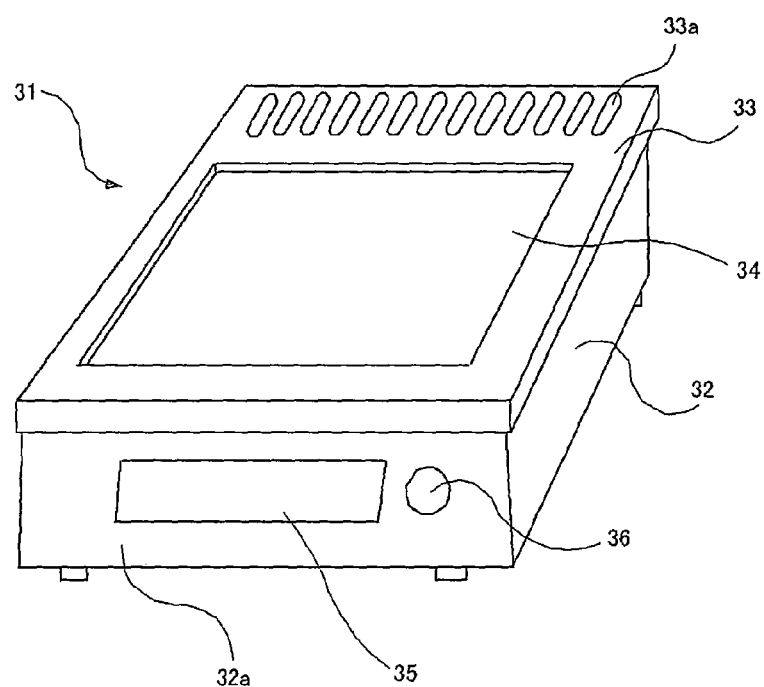
FIG. 7 is a schematic perspective view of an electric cooker, for illustrating a configuration example of an electromagnetic wave shielding body according to the present invention.
Figure 8:
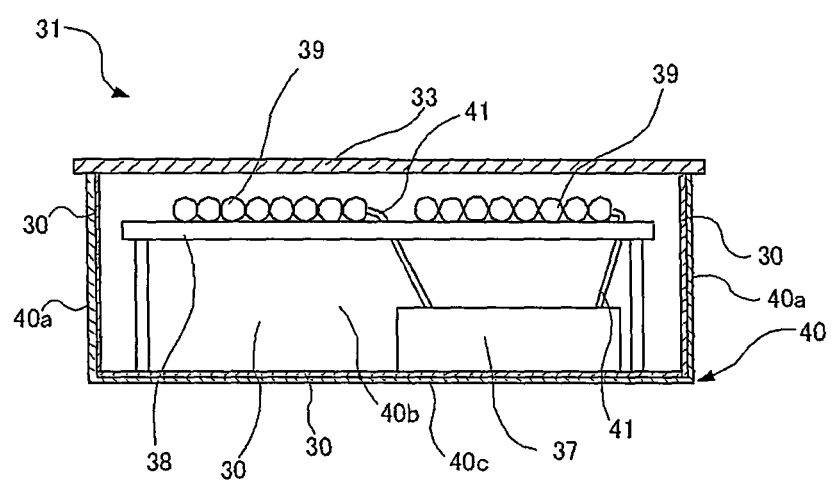
FIG. 8 is a schematic sectional view of the electric cooker.

Furthermore, a configuration example of the electromagnetic wave shielding body according to the present invention will be described as Example 12 below, referring to FIGS. 7 and 8. FIG. 7 is a schematic perspective view showing the appearance of an electric cooker (electromagnetic induction heating cooker) 31 equipped with an electromagnetic wave shielding body 30 (see FIG. 8) of the present invention. FIG. 8 is a schematic vertical sectional view showing schematically the inside configuration of the electric cooker 31 in the condition where a cabinet 32 of the electric cooker 31 is removed, for illustrating the electromagnetic wave shielding body 30 provided in the electric cooker 31. The electric cooker 31 has the cabinet 32 serving as a housing, a top plate 33 provided with a plurality of air holes 33a is mounted on the upper side of the cabinet 32, and a cooking plate 34 on which to mount a heating vessel such as a pan or pot is fitted in the vicinity of a central part of the top plate 33. In addition, a console panel 35 and a heating control knob 36 are provided at a cabinet front surface (the surface facing the human body) 32a. A cooling fan (not shown) and as shown in FIG. 8, a box body 40 containing a control circuit unit 37 and heating coils 39, 39 disposed on a coil support base 38 are contained in the cabinet. In addition, sheet-formed electromagnetic wave shielding bodies 30, 30, 30, 30 composed of the dielectric raw materials according to the present invention are attached to the inside walls of both side surfaces 40a, 40a, a front surface (not shown), a rear surface 40b and a bottom surface 40c of the box body 40. The heating coils 39, 39 are connected to a connection terminal part (not shown) of the control circuit unit 37 by connection cords 41, 41, whereby high-frequency currents supplied to the heating coils 39, 39 can be controlled. Here, the means of attaching the electromagnetic wave shielding body 30 is not particularly limited; for example, the electromagnetic wave shielding body 30 can be attached by an appropriate means, such as by adhering it to the inside wall of the box body 40 by use of an appropriate heat-resistant adhesive. Besides, in the case of an electric cooker having a cabinet 32 on the outside of a box body, like the electric cooker 31, the electromagnetic wave shielding body 30 may be attached not to the inside wall of the box body but to the outside wall of the box body or to the inside wall of the cabinet 32. Further, in the case of an electric cooker wherein, for example, a control circuit unit and a heating coil are contained respectively in separate box bodies, it is preferable to attach the electromagnetic wave shielding bodies to the individual box bodies. In addition, in the case where the box body does not have a rear surface, for example, a configuration in which the electromagnetic wave shielding body is not mounted on the rear side (the opposite side of the human body) may be adopted.

Incidentally, the configuration of the electric cooker to be fitted with the electromagnetic wave shielding body of the present invention is not particularly limited. For example, electric cookers such as known various kinds of electromagnetic induction heating cookers, other than the above-described electric cooker (electromagnetic induction heating cooker) 31, can be utilized. The electromagnetic wave shielding body according to the present invention can be disposed by various appropriate means so as to be interposed between an electromagnetic wave generating source and the human body, in each of the various electric cookers.

According to the above configuration example, with the electromagnetic wave shielding body of the present invention mounted between the electromagnetic wave generating source of an electric cooker and the human body, the leakage of electromagnetic waves toward the human body side can be reduced. In addition, since the electromagnetic wave shielding body according to the present invention is composed of a dielectric raw material using a silicone rubber base material, it can be molded and to some extent, can be molded into the necessary shape. Incidentally, the electromagnetic wave shielding body of the present invention may be or may not be set in close contact with, for example, the inside wall of the box body of the electric cooker. However, when the electromagnetic wave shielding body is set in close contact with the inside wall or the like, a higher electromagnetic wave shielding effect can be expected.

INDUSTRIAL APPLICABILITY

The dielectric raw material according to the present invention has a prolonging effect on the useful life of a battery by enhancing the radiation efficiency of an antenna in a portable phone, for example, at the time of communications through the portable phone. In addition, the dielectric raw material can reduce the influence of electromagnetic waves on the human body at the time of talking, and can enhance the communication performance. Besides, the dielectric raw material of the present invention enables communications over longer distances with less electric power, by enhancing the radiation efficiency of an antenna device, and can be incorporated into a circuit without spoiling the characteristics of the antenna. In addition, the use of the dielectric raw material according to the present invention makes it possible to reduce unnecessary radiations from an electric cooker or the like.

The invention claimed is:

1. A dielectric raw material comprising:
a silicone rubber base material containing a silicone rubber as a main material; and
carbon dispersed in the silicone rubber base material, wherein
the carbon is unevenly distributed in the silicone rubber base material or the carbon is contained with at least part of carbon materials contacting each other, so that conductive paths cover an area of not less than ¼ times of the surface area of the dielectric raw material, in
a dielectric raw material containing 150 to 300 parts by weight of said carbon per 100 parts by weight of said silicone rubber, wherein
the dielectric raw material is formed by crosslinking and molding a mixture of said silicone rubber in its non-crosslinked state, a non-crosslinked organic polymer, and said carbon, and the amount of the non-crosslinked organic polymer is 1 to 15 parts by weight per 100 parts by weight of the non-crosslinked silicone rubber, and combining and blending at least two kinds of said carbon having different shapes, wherein
said organic polymer is liquid ethylenepropylene rubber or polybutene, and wherein
the at least two kinds of said carbon are selected from the group consisting of spherical carbon, carbon nanotubes, and conductive carbon.

2. The dielectric raw material as set forth in claim 1, wherein the dielectric raw material has a property wherein for a 1 mm-thick sheet of said dielectric raw material, the value $\in_r'$ of the real part of the complex relative permittivity $\in_r$ at 900 MHz is not less than 100 and the value $\in_r''$ of the imaginary part of the complex relative permittivity $\in_r$ at 900 MHz is not less than 100.

3. The dielectric raw material as set forth in claim 1, wherein the mixture of the silicone rubber is essentially free of a crosslinked particulate polymer.

4. The dielectric raw material as set forth in claim 1, wherein the spherical carbon is employed in combination with carbon nanotubes or conductive carbon.

5. The dielectric raw material as set forth in claim 1, wherein the spherical carbon is employed in combination with conductive carbon, the amount of said spherical carbon being 50 to 99 wt. % in the total amount of said carbon, and the amount of conductive carbon being 1 to 50 wt. % in the total amount of said carbon.

6. The dielectric raw material as set forth in claim 1, wherein the conductive carbon and the carbon nanotubes are employed in combination, the amount of carbon nanotubes being 1 to 99 wt. % in the total amount of said carbon, and the amount of the conductive carbon being 1 to 99 wt. % in the total amount of said carbon.

7. The dielectric raw material as set forth in claim 1, wherein the carbon nanotubes are employed in combination of a spherical carbon, the amount of the carbon nanotubes being 0.5 to 95 wt. % in the total amount of said carbon, and the amount of said spherical carbon being 5 to 99.5 wt. % in the total amount of said carbon.

8. The dielectric raw material as set forth in claim 1, wherein a DBP oil absorption measured according to ASTM D 2414-79 of said conductive carbon is not less than 100 cm$^3$/100 g and the BET specific surface area of said conductive carbon is not less than 30 m$^2$/g.

9. The dielectric raw material as set forth in claim 1, wherein said carbon is in the state of being present in said non-crosslinked organic polymer preferentially to being present in said non-crosslinked silicone rubber.

10. An antenna device comprising a dielectric raw material as set forth in claim 1.

11. The antenna device as set forth in claim 10, which is a built-in antenna device of a portable phone.

12. A portable phone equipped with an electromagnetic wave shielding body using a dielectric raw material as set forth in claim 1.

13. An electromagnetic wave shielding body comprising a dielectric raw material as set forth in claim 1.

14. The electromagnetic wave shielding body as set forth in claim 13, which is an electric cooker electromagnetic wave shielding body for shielding electromagnetic waves generated from an electric cooker.

* * * * *

UNITED STATES PATENT AND TRADEMARK OFFICE
CERTIFICATE OF CORRECTION

PATENT NO.        : 8,715,533 B2                    Page 1 of 1
APPLICATION NO.   : 11/667318
DATED             : May 6, 2014
INVENTOR(S)       : Kazuhisa Takagi et al.

It is certified that error appears in the above-identified patent and that said Letters Patent is hereby corrected as shown below:

ON THE TITLE PAGE:

At item (73), Assignee, change:

"Asahi R&D Co., Ltd., Saitama-Shi (JP)" to

--Asahi FR R&D Co., Ltd., Saitama-Shi (JP)--.

Signed and Sealed this
Sixteenth Day of September, 2014

Michelle K. Lee
*Deputy Director of the United States Patent and Trademark Office*